US009508426B2

(12) United States Patent
Bedeschi (10) Patent No.: US 9,508,426 B2
(45) Date of Patent: Nov. 29, 2016

(54) PROGRAM-DISTURB MANAGEMENT FOR PHASE CHANGE MEMORY (71) Applicant: MICRON TECHNOLOGY, INC., Boise, ID (US)

(72) Inventor: Ferdinando Bedeschi, Biassono (IT)

(73) Assignee: MICRON TECHNOLOGY, INC., Boise, ID (US)

( * ) Notice: Subject to any disclaimer, the term of this patent is extended or adjusted under 35 U.S.C. 154(b) by 109 days.

(21) Appl. No.: 14/563,748

(22) Filed: Dec. 8, 2014

(65) Prior Publication Data

US 2015/0095560 A1 Apr. 2, 2015

Related U.S. Application Data (63) Continuation of application No. 13/474,609, filed on May 17, 2012, now Pat. No. 8,910,000.

(51) Int. Cl.
*G11C 13/00* (2006.01)
*G06F 11/10* (2006.01)
(Continued)

(52) U.S. Cl.
CPC ....... *G11C 13/0004* (2013.01); *G06F 11/1048* (2013.01); *G11C 13/004* (2013.01); *G11C 13/0033* (2013.01); *G11C 13/0035* (2013.01); *G11C 13/0069* (2013.01); *G11C 16/107* (2013.01); *G11C 16/3418* (2013.01);
(Continued)

(58) Field of Classification Search
CPC ............... G06F 11/1048; G11C 13/00; G11C 13/0004; G11C 13/0033; G11C 13/0035; G11C 13/004; G11C 13/0069; G11C 16/107; G11C 16/3418; G11C 16/3422; G11C 16/3427; G11C 16/3431; G11C 16/3495; G11C 2013/0054; G11C 29/021; G11C 29/028
USPC ......... 714/718, 721; 365/200, 201, 208, 212
See application file for complete search history.

(56) References Cited

U.S. PATENT DOCUMENTS 6,868,025 B2 3/2005 Hsu
7,266,741 B2 9/2007 Luk
(Continued)

FOREIGN PATENT DOCUMENTS

CN 101471130 7/2009
CN 101699562 4/2010
(Continued)

OTHER PUBLICATIONS

First Office Action Nov. 5, 2013 in corresponding Chinese Appl. No. 201110317448.2, filed Oct. 12, 2011, 9 pages.
(Continued)

*Primary Examiner* — John J Tabone, Jr.
(74) *Attorney, Agent, or Firm* — Holland & Hart LLP (57) ABSTRACT Methods, systems, and devices related to memory, including read or write performance of a phase change memory, are described. A plurality of memory cells of a memory array may be read. A total number of read errors resulting from the read operation of the plurality of memory cells may be determined, and reference read currents may be adjusted if the total number of read errors exceeds an error threshold. In some examples, adjusting reference read currents includes reading a reference memory cell, determining a current shift for the reference memory cell, and adjusting read currents for other memory cells of the memory array by a current delta based at least in part on the current shift.

20 Claims, 6 Drawing Sheets (51) Int. Cl.
*G11C 29/02* (2006.01)
*G11C 16/10* (2006.01)
*G11C 16/34* (2006.01)

(52) U.S. Cl.
CPC ....... *G11C16/3422* (2013.01); *G11C 16/3427* (2013.01); *G11C 16/3431* (2013.01); *G11C 16/3495* (2013.01); *G11C 29/021* (2013.01); *G11C 29/028* (2013.01); *G11C 13/00* (2013.01); *G11C 2013/0054* (2013.01)

(56) References Cited

U.S. PATENT DOCUMENTS

| | | | |
|---|---|---|---|
| 7,308,471 B2 | 12/2007 | Rumynin | |
| 7,352,605 B2 | 4/2008 | Kang et al. | |
| 7,495,944 B2 | 2/2009 | Parkinson et al. | |
| 7,554,861 B2 | 6/2009 | Vimercati et al. | |
| 7,568,135 B2 * | 7/2009 | Cornwell | G11C 11/5628 365/185.01 |
| 7,630,257 B2 | 12/2009 | Madan et al. | |
| 7,701,765 B2 | 4/2010 | Aritome | |
| 7,952,922 B2 | 5/2011 | Aritome | |
| 7,984,360 B2 | 7/2011 | Sharon et al. | |
| 8,031,526 B1 | 10/2011 | Wu et al. | |
| 8,040,723 B2 | 10/2011 | Sheu et al. | |
| 8,050,086 B2 | 11/2011 | Shalvi et al. | |
| 8,144,505 B2 | 3/2012 | Lee | |
| 8,159,869 B2 | 4/2012 | Park et al. | |
| 8,169,825 B1 | 5/2012 | Shalvi et al. | |
| 8,228,701 B2 | 7/2012 | Sokolov et al. | |
| 8,238,157 B1 | 8/2012 | Sommer et al. | |
| 8,300,478 B2 | 10/2012 | Shalvi et al. | |
| 8,310,876 B2 | 11/2012 | Yoo et al. | |
| 8,335,107 B2 | 12/2012 | Lee | |
| 8,369,147 B2 | 2/2013 | Aritome | |
| 8,391,062 B2 | 3/2013 | Jang | |
| 8,437,185 B2 | 5/2013 | Shalvi et al. | |
| 8,462,548 B2 | 6/2013 | Aritome | |
| 8,467,237 B2 | 6/2013 | Bedeschi et al. | |
| 8,570,804 B2 | 10/2013 | Shalvi et al. | |
| 8,593,873 B2 | 11/2013 | Cerafogli et al. | |
| 8,681,543 B2 | 3/2014 | Jang | |
| 8,693,247 B2 | 4/2014 | Yoon et al. | |
| 8,717,792 B2 | 5/2014 | Sokolov et al. | |
| 8,743,622 B2 | 6/2014 | Tanzawa | |
| 8,767,469 B2 | 7/2014 | Kim | |
| 8,910,000 B2 | 12/2014 | Bedeschi | |
| 9,001,575 B2 | 4/2015 | Bedeschi | |
| 2004/0225705 A1 | 11/2004 | Rumynin | |
| 2006/0123288 A1 | 6/2006 | Luk | |
| 2007/0255891 A1 | 11/2007 | Chow et al. | |
| 2007/0263440 A1* | 11/2007 | Cornwell | G11C 11/5621 365/185.03 |
| 2007/0263441 A1* | 11/2007 | Cornwell | G06F 11/1068 365/185.03 |
| 2007/0263454 A1* | 11/2007 | Cornwell | G11C 11/5642 365/185.24 |
| 2007/0277060 A1* | 11/2007 | Cornwell | G11C 11/5628 714/54 |
| 2008/0084773 A1 | 4/2008 | Madan et al. | |
| 2008/0158948 A1 | 7/2008 | Sharon et al. | |
| 2008/0175054 A1* | 7/2008 | Hancock | G11C 11/5671 365/185.09 |
| 2009/0016100 A1 | 1/2009 | Jeong | |
| 2009/0237977 A1 | 9/2009 | Ramani et al. | |
| 2010/0020615 A1 | 1/2010 | Miwa et al. | |
| 2010/0067286 A1 | 3/2010 | Taylor et al. | |
| 2010/0165725 A1 | 7/2010 | Bedeschi | |
| 2010/0265764 A1 | 10/2010 | Yoo et al. | |
| 2011/0216587 A1 | 9/2011 | Lee | |
| 2011/0258495 A1* | 10/2011 | Tseng | G11C 16/3418 714/704 |
| 2012/0127801 A1 | 5/2012 | Kim | |
| 2012/0195118 A1 | 8/2012 | Yang | |
| 2012/0262970 A1 | 10/2012 | Sokolov et al. | |
| 2012/0262971 A1 | 10/2012 | Sokolov et al. | |
| 2012/0268990 A1 | 10/2012 | Sommer et al. | |
| 2012/0284587 A1* | 11/2012 | Yu | G06F 3/0608 714/773 |
| 2012/0290897 A1 | 11/2012 | Yoon et al. | |
| 2013/0007353 A1 | 1/2013 | Shim et al. | |
| 2013/0077392 A1 | 3/2013 | Park | |
| 2013/0141972 A1 | 6/2013 | Yoon et al. | |
| 2013/0141974 A1 | 6/2013 | Jang | |
| 2013/0167251 A1 | 6/2013 | Pio | |
| 2013/0182510 A1 | 7/2013 | Tanzawa | |
| 2013/0235665 A1 | 9/2013 | Khaef | |
| 2013/0262743 A1 | 10/2013 | Bedeschi | |
| 2013/0279260 A1 | 10/2013 | Yoon et al. | |
| 2013/0290604 A1 | 10/2013 | Bedeschi | |
| 2013/0343131 A1* | 12/2013 | Wu | G11C 16/26 365/185.24 |

FOREIGN PATENT DOCUMENTS

| | | |
|---|---|---|
| JP | 2004-273110 | 9/2004 |
| KR | 10-2009-0006631 | 1/2009 |
| WO | WO 2008/085254 A1 | 7/2008 |

OTHER PUBLICATIONS

Japanese Notice of Rejection Grounds dated Feb. 5, 2013 in corresponding Japanese Appl. No. 2011-203372, filed Sep. 16, 2011, 9 pages.

Korean Preliminary Rejection dated Jan. 25, 2013 in corresponding Korean Appl. No. 10-2011-105088, filed Oct. 14, 2011, 10 pages.

* cited by examiner

PROGRAM-DISTURB MANAGEMENT FOR PHASE CHANGE MEMORY

CROSS-REFERENCE TO RELATED APPLICATIONS

This patent application is a continuation of U.S. patent application Ser. No. 13/474,609, which was filed on May 17, 2012, and which is incorporated by reference herein in its entirety.

BACKGROUND

1. Field

Subject matter disclosed herein relates to a memory device, and more particularly to read or write performance of phase change memory.

2. Information

Phase change memory (PCM) may operate based, at least in part, on behavior and properties of one or more particular phase change materials, such as chalcogenide alloy and/or germanium antimony telluride (GST), just to name a few examples. Crystalline and amorphous states of such materials may have different electrical resistivities, thus presenting a basis by which information may be stored. The amorphous, high resistance state may represent a stored first binary state and the crystalline, low resistance state may represent a stored second binary state. Of course, such a binary representation of stored information is merely an example: Phase change memory may also be used to store multiple memory states, represented by varying degrees of phase change material resistivity, for example.

A PCM memory cell may transition from an amorphous state to a crystalline state by applying a bias signal to the memory cell. Characteristics of a bias signal, such as peak magnitude and/or pulse width, for example, may be selected to allow a transition to a crystalline state.

Nonvolatile memory devices, such as PCM, may comprise wordlines and bitlines to program an array of memory cells. As density of memory cells in an array increase, distances between adjacent wordlines or bitlines may decrease. Decreased spacing among wordlines or bitlines may lead to undesirable effects, such as capacitive coupling, crosstalk, or proximity-disturb, just to name a few examples.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

A memory array comprising PCM cells may be programmed using wordlines or bitlines that provide electrical programming pulses or signals representing one-bits or zero-bits in individual PCM cells. While one wordline may be used to program one row of PCM cells, an adjacent wordline may be used to program an adjacent row of PCM cells. Adjacent rows of PCM cells may be spaced apart to provide structural, electrical, or thermal insulation between the adjacent rows. However, as the density of PCM cells in an array increase, spacing between adjacent rows of PCM cells may decrease, thus reducing the amount of available semiconductor material providing thermal insulation between the adjacent rows. Among other things, thermal contact among PCM cells may undesirably lead to an increased likelihood that a state of one PCM cell may be disturbed by the state of a neighboring PCM cell. A PCM cell thermally affecting a state of another PCM cell may be called a "proximity-disturb" event, which may include a "program disturb" event or a "read disturb" event, depending on whether a program process or a read process is involved. For example, a zero-bit of a PCM cell may be cyclically re-programmed with a particular frequency in a process of refreshing the state of the PCM cell. Such re-programming a zero-bit may comprise applying a relatively high amplitude electrical programming pulse or signal so as to melt and then cool phase change material of the PCM cell, as mentioned above. A process of melting phase change material of the PCM cell, however, may inadvertently add heat to one or more neighboring PCM cells. A neighboring PCM cell nearest the re-programmed PCM cell may be affected more than other neighboring PCM cells. In one implementation, a neighboring PCM cell nearest the re-programmed PCM cell may be located in a wordline adjacent to a wordline of the re-programmed PCM cell. Thus, a neighboring PCM cell located in a wordline adjacent to a wordline of the re-programmed PCM cell may be program-disturbed by the re-programming process of the neighboring PCM cell. As the frequency or number of times of refreshing the state of a PCM cell increases, so may the likelihood of occurrence of a program-disturb event, induced by increasing ambient temperatures of a memory array, for example.

PCM cells in a zero-bit, amorphous state may be more susceptible to effects of a program-disturb event compared to PCM cells in a one-bit, crystalline state. Such effects may change a PCM memory cell in a zero-bit state to a one-bit state or vise versa. For example, a program-disturb event may erroneously change a state of a PCM cell from a zero-bit state to a one-bit state. This may be true, at least in part, because an amorphous state may comprise a metastable state with respect to a relatively stable crystalline state. Additional energy applied to such an amorphous state (via thermal or electrical energy, for example) may accelerate a crystallization process. Such additional energy may comprise ambient thermal energy from neighboring PCM cells being repeatedly programmed, as mentioned above. In this case, heat generated during programming operation of neighboring PCM cells may diffuse from the neighboring PCM cells to accelerate crystallization of another PCM cell in a zero-bit, amorphous state. In another implementation, a read-disturb event may occur if a PCM cell is read many times during a relatively short period of time to create excess heat.

Embodiments described herein may include processes or electronic architecture to correct program states stored in one or more cells of a memory array. For example, program states of a portion of a memory array may be erroneously changed by a program-disturb event brought about, at least in part, by programming a neighboring portion of the memory array. In one implementation, correcting program states erroneously changed by a program-disturb event may be preceded by a process of determining whether a proximity-disturb event has occurred. Such a process, for example, may include programming a first known sequence of bits to a first reference portion of a memory array and programming a second known sequence of bits to a second reference portion of the memory array. If data is to be programmed in the memory array, such a process may further include re-programming the second known sequence of bits in the second reference portion while programming the data. The first known sequence of bits in the first reference portion may be read to detect any bit errors in the first known sequence of bits in the first portion. Detecting such errors may indicate a likelihood as to whether the first known sequence of bits in the first reference portion is proximity-disturbed by effects of re-programming the second reference portion may then be determined. The first reference portion may be located physically adjacent to the second reference portion so as to be susceptible to proximity-disturb effects from the second portion. Here, one portion of memory being "physically adjacent" to another portion of memory means that there are no intervening wordlines present between the adjacent portions of memory. Optionally, "physically adjacent" may mean there are approximately one or two wordlines present between the adjacent portions of memory. In one implementation, a first reference portion may be located in one memory block and the second reference portion may be located in another memory block, though claimed subject matter is not limited in this respect. In another implementation, a first reference portion may be located in one memory buffer and a second reference portion may be located in another memory buffer, though claimed subject matter is not limited in this respect. A memory buffer may comprise a program buffer that may be included in a memory device that also includes a memory array. In one implementation, a memory buffer may comprise a portion of a memory array. Such a memory buffer may comprise memory to temporarily store a plurality of bits during a process of writing the bits to a memory array, for example. Of course, such details of a memory buffer are merely examples, and claimed subject matter is not so limited.

In an embodiment, a process to correct erroneous program states stored in one or more cells of a memory array may comprise measuring a shift of cell current for a particular reference voltage to read one or more neighboring reference cells. For example, a proximity-disturb event may bring about, at least in part, such erroneous program states. Neighboring reference cells may be located in a memory array so as to be similarly affected by the same proximity-disturb events that affected the one or more cells of a memory array. Thus, neighboring reference cells may also store erroneous program states. However, neighboring reference cells may have previously stored a known sequence of bits. Differences, or current "deltas", between currently measured reference cell states and values at which reference cell states were originally programmed may be determined. Such current deltas may be added to or subtracted from read currents of PCM cells for individual read-current steps, as described below, for example. Adjusting read currents by adding or subtracting current deltas may allow for compensating for proximity-disturb effects.

In one implementation, a counter value may be stored in some location of a memory array, wherein the counter value may represent a number of times that a particular portion of the memory array is programmed or re-programmed. In such a case, reading a first known sequence of bits in the first portion to detect any bit errors may be performed in response to a counter value exceeding a threshold number. As mentioned above, such detected bit errors may indicate a likelihood as to whether a known sequence of bits in a reference portion of the memory array is proximity-disturbed. Accordingly, such a likelihood may be based, at least in part, on such a counter value. In another implementation determining likelihood as to whether a known sequence of bits in a reference portion of a memory array is proximity-disturbed may be performed in response to exceeding a threshold bit error rate (BER), as explained below. In yet another implementation, reading a first known sequence of bits in a first portion to detect any bit errors may be performed in response to exceeding a threshold BER.

In an embodiment, a non-volatile memory device may include an ability to correct program states stored in one or more cells of a memory array. For example, program states of a portion of a memory array may be erroneously changed by a program-disturb event brought about, at least in part, by a neighboring portion of the memory array being programmed. In one implementation, correcting program states erroneously changed by a program-disturb event may be preceded by a process of determining whether a proximity-disturb event has occurred. For example, a memory device may comprise a controller to program a first known sequence of bits in a first reference portion of a memory array, program a second known sequence of bits in a second reference portion of the memory array, re-program the second known sequence of bits in the second reference portion while programming data to the memory array, and determine a likelihood as to whether the first known sequence of bits in the first reference portion is proximity-disturbed by the re-programming. Such a first reference portion may be located in one program buffer and such a second reference portion may be located in another program buffer, wherein the first reference portion may be located physically adjacent to the second reference portion. For a memory cell storing at least one of a known sequence of bits in a first reference portion of a memory array a controller may measure a shift of cell current for a particular reference voltage to read the memory cell. A controller may further adjust a particular reference voltage to read at least one additional memory cell, wherein the adjusting may be based, at least in part, on the measured shift of cell current. In one implementation, a controller may store a counter value in a memory array or in a location external to the memory array, for example, wherein such a counter value may represent a number of times that the memory array is programmed or re-programmed. Such a counter value may be used, among other things, to determine likelihood as to whether a known sequence of bits in a reference portion of the memory array is proximity-disturbed. Such a memory array, which may comprise a PCM array, may be incorporated in at least one of the following: a desktop computer, a laptop computer, a workstation, a server device, a personal digital assistant, a mobile communication device, or any combination thereof, though claimed subject matter is not so limited.

Figure 1:
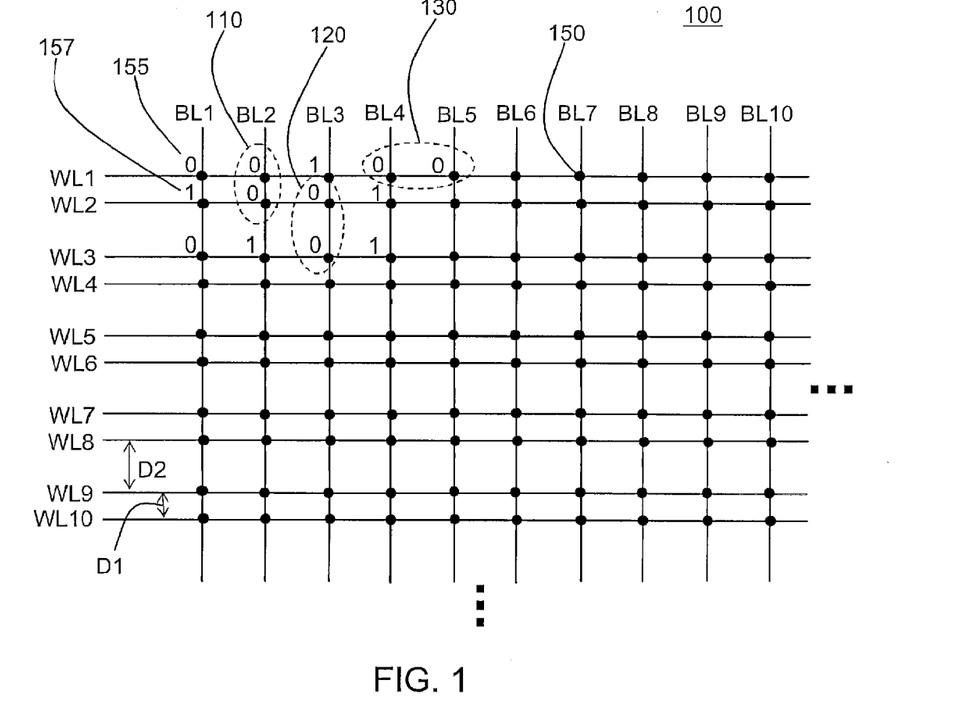
FIG. 1 is a schematic diagram of a portion of a memory array, according to an embodiment.

FIG. 1 is a schematic diagram of a portion of a memory array 100, according to an embodiment. For example, a memory device may comprise memory array 100 and address decoding circuitry (not shown) to read from or write to selected memory cells via bitlines or wordlines. Memory cells 150 may be connected at intersections of wordlines and bitlines and may be selectively addressed by the wordlines or bitlines. For example, memory cell 155 may be programmed to be in a zero-bit state by placing a zero-bit on wordline WL1 in a bitline BL1 position. Similarly, memory cell 157 may be programmed to be in a one-bit state by placing a one-bit on wordline WL2 in a bitline BL1 position. In another example, FIG. 1 shows wordline WL3 with bits 0-1-0-1 in bitline positions BL1, BL2, BL3, and BL4, respectively. Memory cells 150 may comprise PCM cells, though claimed subject matter is not so limited.

In an embodiment, adjacent wordlines in memory array 100 may be physically spaced apart by two different distances. For example, adjacent wordlines WL9 and WL10 may be spaced apart by a distance D1, while adjacent wordlines WL8 and WL9 may be spaced apart by a distance D2. The different spacing distances may be determined, at least in part, from fabrication architecture of a semiconductor memory device that includes memory array 100, for example. Thus, adjacent wordlines may be physically grouped in pairs with an inter-pair spacing of distance D1, whereas such pairs of wordlines may be spaced apart a distance D2. Referring to FIG. 1, for example, adjacent wordlines WL1 and WL2 comprise a wordline pair separated by a distance D1, adjacent wordlines WL3 and WL4 comprise a wordline pair separated by a distance D1, adjacent wordlines WL5 and WL6 comprise a wordline pair separated by a distance D1, adjacent wordlines WL7 and WL8 comprise a wordline pair separated by a distance D1, and adjacent wordlines WL9 and WL10 comprise a wordline pair separated by a distance D1. In contrast, wordline WL2 and wordline WL3, though they are adjacent to one another, may be separated by a distance D2, which may be greater than inter-pair spacing distance D1. To continue the example, wordline WL4 and wordline WL5 may be separated by a distance D2, wordline WL6 and wordline WL7 may be separated by a distance D2, and wordline WL8 and wordline WL9 may be separated by a distance D2.

As mentioned above, thermal contact among PCM cells may lead to a program-disturb event, wherein a state of one PCM cell may be disturbed by the state of a neighboring PCM cell. A neighboring PCM cell nearest the re-programmed PCM cell may be affected more than other neighboring PCM cells. In one implementation, a neighboring PCM cell nearest the re-programmed PCM cell may be located in a wordline adjacent to a wordline of the re-programmed PCM cell. Thus, a neighboring PCM cell located in a wordline adjacent to a wordline of the re-programmed PCM cell may be program-disturbed by the re-programming process of the neighboring PCM cell. In memory array 100, for example, memory cells included in wordlines of a wordline pair may be physically near one another so as to be affected by a program-disturb event.

More specifically, memory cells included in wordlines of a wordline pair along a same bitline may be physically near enough to one another so as to be affected by a program-disturb event. On the other hand, memory cells included in wordlines of different wordline pairs, even if on a same bitline, may be physically separated enough so as to not be substantially affected by a program-disturb event. Returning to FIG. 1, for example, memory cells in memory cell pair 110 may program-disturb one another, whereas memory cells in memory cell pair 120 need not program-disturb one another.

As discussed above, PCM cells in a zero-bit, amorphous state may be more susceptible to effects of a program-disturb event compared to PCM cells in a one-bit, crystalline state. For example, memory cells in zero-bit states in memory cell pair 110 may program-disturb one another, whereas memory cells 155 and 157 in zero-bit and one-bit states, respectively, need not program-disturb one another.

In one implementation, PCM cells in adjacent wordlines of wordline pairs may be more susceptible to effects of a program-disturb event compared to PCM cells in a same wordline and adjacent bitlines. Such effects may change a PCM memory cell in a zero-bit state to a one-bit state or vise versa. For example, memory cells in memory cell pair 130 need not program-disturb one another, even though the adjacent memory cells may both be in zero-bit states.

Figure 2:
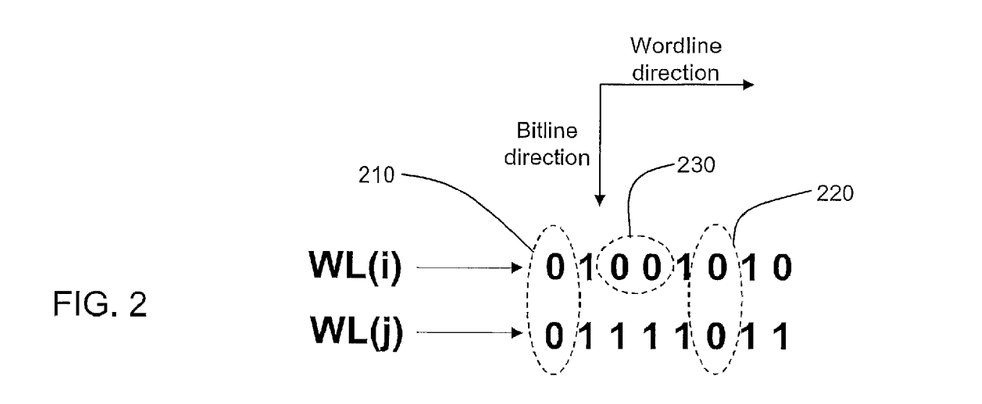
FIG. 2 is a schematic diagram of an arrangement of program bits on adjacent wordlines, according to an embodiment.

FIG. 2 is a schematic diagram of an arrangement of program bits on adjacent wordlines, according to an embodiment. FIG. 2 may depict a memory array similar to that of FIG. 1, but without explicitly showing memory cells, wordlines, and bitlines. For example, in FIG. 2, a wordline WL(i) (i comprises an integer) may have bits 0-1-0-0-1-0-1-0 on consecutive bitlines, such as BL1, BL2, BL3, and so on, shown in FIG. 1. An adjacent wordline WL(j) may have bits 0-1-1-1-1-0-1-1 on the same consecutive bitlines as for WL(i). As discussed above, PCM cells in a zero-bit, amorphous state may be more susceptible to effects of a program-disturb event compared to PCM cells in a one-bit, crystalline state. Also, PCM cells in adjacent wordlines may be more susceptible to effects of a program-disturb event compared to PCM cells in a same wordline and adjacent bitlines. Thus, zero-bit pair 210, comprising zero bits on a same bitline and adjacent wordlines WL(i) and WL(j), may lead to an undesirable program-disturb event. As another example, zero-bit pair 220, comprising zero bits on a same bitline and adjacent wordlines WL(i) and WL(j), may also lead to an undesirable program-disturb event. However, in another example, zero-bit pair 230, comprising zero bits on a same wordline WL(i) but adjacent bitlines, need not lead to a program-disturb event. Accordingly, as discussed above, it may be desirable to arrange a particular order of one-bits and zero-bits to be written to memory cells in two adjacent wordlines at a time.

Figure 3:
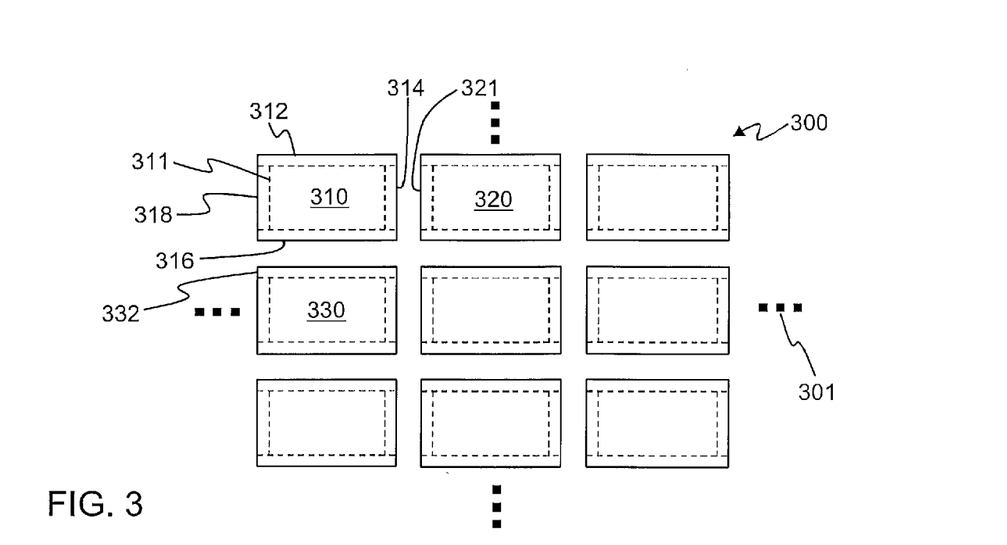
FIG. 3 is a schematic diagram illustrating a plurality of memory array portions, according to an embodiment.

FIG. 3 is a schematic diagram illustrating a plurality of memory array units 300, according to an embodiment 300. For example, memory array units 300 may comprise a portion of memory array 100 shown in the embodiment of FIG. 1. Such a plurality of memory array units may comprise a block, a page, a partition, or any other-sized portion of an array of memory cells, for example. Nine such memory array units 300 are shown in FIG. 3, but claimed subject matter is not limited to any particular size. For example, 3-dot symbols 301 indicate any number of memory array units 300 may extend in any direction. In one implementation, any of memory array units 300 may comprise a program buffer. Individual memory array units 300 may comprise an array portion to store data and one or more border portions that may be used to store reference bits, as discussed below. Data may comprise a plurality of bits to be stored memory array units. Border portions in a memory array unit may be physically adjacent to other border portions in neighboring memory array units. For example, memory array unit 310 may comprise array portion 311 and border portions 312, 314, 316, and 318, for example. For a particular example, memory array unit 310 may include border portion 316 that is physically adjacent to border portion 332 of memory array unit 330, and vise versa. Similarly, memory array unit 310 may include border portion 314 that is physically adjacent to border portion 321 of memory array unit 320, and vise versa. Memory array unit 310 may also include border portions 312 and 318 that are physically adjacent to border portions of neighboring memory array units not shown in FIG. 3, for example. As explained below, such border portions of neighboring memory arrays may program-disturb one another.

Figure 4:
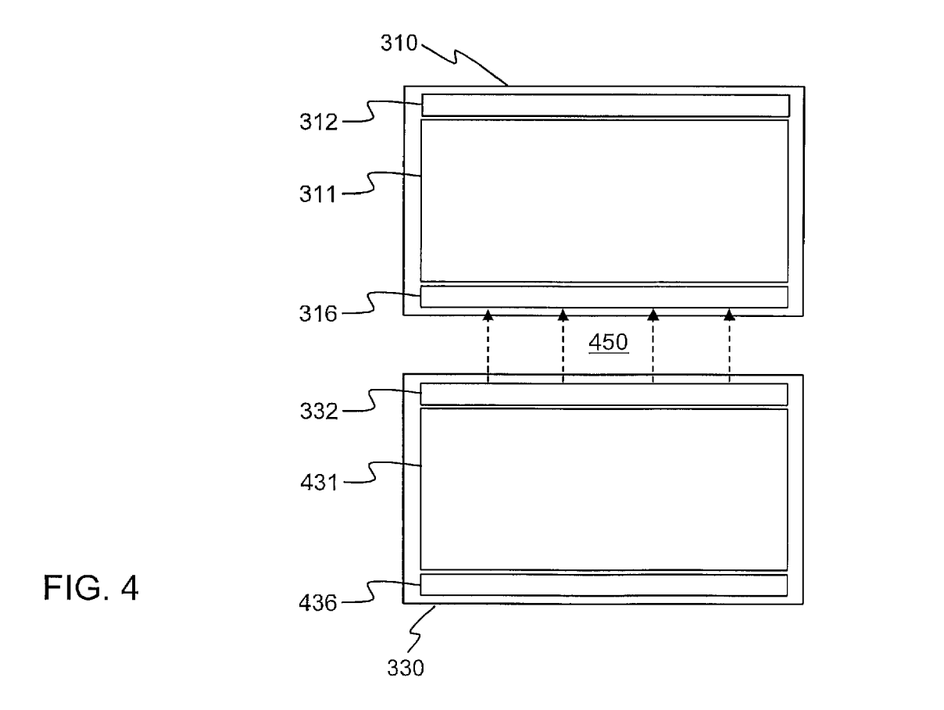
FIG. 4 is a schematic diagram illustrating features of memory array portions, according to an embodiment.

FIG. 4 is a schematic diagram illustrating a close-up view of memory array units 310 and 330 of the embodiment shown in FIG. 3. As discussed above, heat generated during programming operations of neighboring PCM cells may diffuse from the neighboring PCM cells to accelerate crystallization of other PCM cells in a zero-bit, amorphous state. Thus, a program-disturb event may occur if a PCM cell is programmed or re-programmed many times (e.g., tens or thousands of times or more) during a relatively short period of time (e.g., seconds or minutes) to create excess heat. Thus, for example, program states of at least a portion of a memory array unit 310 may be erroneously changed by a program-disturb event brought about, at least in part, by programming a neighboring portion of an adjacent memory array unit. For a particular example, program states of a border portion 316 or memory array portion 311 of memory array unit 310 may be erroneously changed by a program-disturb event brought about, at least in part, by programming a neighboring border portion 332 or memory array portion 431 of adjacent memory array unit 330. In this case, heat 450 generated during programming operations of PCM cells in memory array unit 330 (e.g., portions 332 or 431) may diffuse from the PCM cells to accelerate crystallization of neighboring PCM cells in memory array unit 310 that comprise a zero-bit, amorphous state.

In an embodiment, a border portion of memory that may be program-disturbed is called a "potential victim" (PV) reference portion and a neighboring border portion of memory of which programming may lead to the program-disturb is called an "aggressor" reference portion. Thus, in the example above, program states of PV reference portion 316 may be erroneously changed by a program-disturb event brought about by programming aggressor reference portion 332. In one implementation, correcting program states of memory array unit 310 erroneously changed by a program-disturb event may be preceded by a process of determining whether a proximity-disturb event has occurred. Such a process, for example, may include programming a first known sequence of bits in PV reference portion 316 of memory array unit 310 and programming a second known sequence of bits in aggressor reference portion 332 of memory array unit 330. Such a process may further include re-programming the second known sequence of bits in aggressor portion 332 if data is to be programmed in other portions 431 of memory array unit 330. A likelihood as to whether the first known sequence of bits in the PV reference portion is proximity-disturbed by effects of re-programming the aggressor reference portion may then be determined. The PV reference portion may be located physically adjacent to the aggressor reference portion.

In a counter example, program states of border portion 332 of memory array unit 330 may be erroneously changed by a program-disturb event brought about by programming neighboring border portion 316 of adjacent memory array unit 310. Thus, in this example, border portion 332 comprises a PV reference portion and border portion 316 comprises an aggressor reference portion of a memory array, wherein program states of PV reference portion 332 may be erroneously changed by a program-disturb event brought about by programming aggressor reference portion 316.

As mentioned above, a first known sequence of bits may be programmed in PV reference portion 316 of memory array unit 310 and a second known sequence of bits may be programmed in aggressor reference portion 332 of memory array unit 330. Such PV and aggressor reference portions may comprise PCM cells to store memory cell states for an extended period of time, such as a few seconds or a few years. For example, PV reference portion 316 may comprise PCM cells to store one or more known reference states programmed at the same time that memory array portion 310 is programmed. Similarly, aggressor reference portion 332 may comprise PCM cells to store one or more known reference states programmed at the same time that memory array portion 330 is programmed. Such reference states, for example, may comprise a particular pattern of states. In one implementation, PV or aggressor reference portions 316 and 332 may comprise a relatively small number of PCM cells compared to the number of PCM cells included in memory array portions 310 and 330. For example, aggressor reference portion 332 may comprise eight PCM cells to store eight reference states, whereas memory array portion 431 may comprise 256 k or so PCM cells. Also, PV reference portion 316 may comprise eight PCM cells to store eight reference states. Such reference states in aggressor reference portion 332 may comprise a known pattern of states programmed at the same time as programming data into memory array portion 431. Such a known pattern of reference states may allow for a technique to compensate for program-disturb on PCM cell states in memory array portion 311. Such a technique, for example, may take advantage of a fact that program-disturb changes that occur to PCM cells of memory array portion 311 may also occur to reference cells of PV reference portion 316. Further, since reference cells of PV reference portion 316 may comprise a known pattern of states, a determination may be made as to the amount by which a distribution of PCM cell states of memory array portion 311 changed while programming memory array portion 431. Of course, such details of PCM reference cells and a memory array are merely examples, and claimed subject matter is not limited in this respect.

In an embodiment, PCM cells may be programmed with any one of two or more logic levels based, at least in part, on one or more threshold reference voltages or threshold reference currents that separate the two or more states or logic levels. Accordingly, logic levels stored in PCM cells may be subsequently read and determined based, at least in part, on the same one or more threshold reference currents used to previously program the PCM cells. In particular, reference currents may be used as thresholds to which a cell current during a read process of a PCM cell is compared. A cell current during a read process may result by applying a voltage across a PCM cell so that the cell current during the read process may depend, at least in part, on a resistance of the PCM cell. Accordingly, the state or logic value of a PCM cell, e.g., level of resistance, may be determined by comparing such a cell current during the read process to threshold reference currents. However, cell current for a particular voltage applied across a PCM cell may drift or change in response to temperature changes of the PCM cell. Such temperature changes may be brought about, at least in part, by proximity-disturb from read or program processes of neighboring PCM cells, for example. Because cell currents corresponding to stored logic levels may vary from proximity-disturb effects while threshold reference currents remain unchanged, a comparison of the cell and reference currents may lead to misreading of logic levels stored in the memory cells. As discussed above, embodiments may include techniques that adjust reference currents by adding or subtracting current deltas to allow for compensating for proximity-disturb effects.

Figure 5:
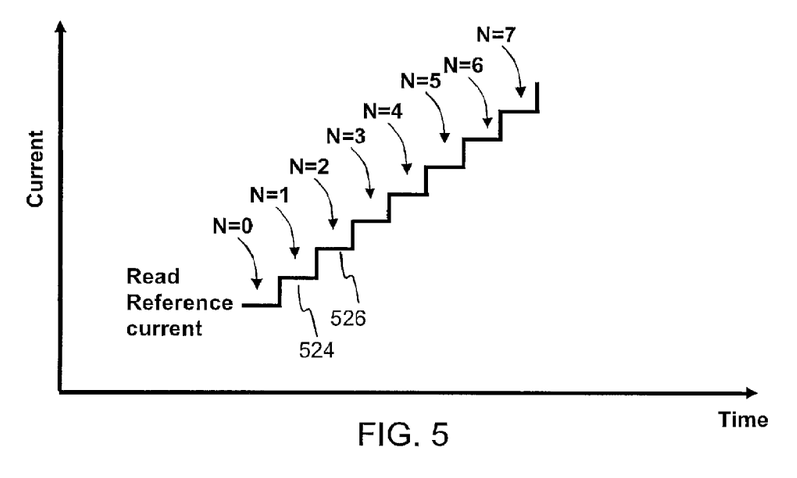
FIG. 5 is a plot of characteristics of reference current values, according to an embodiment.

FIG. 5 shows a plot of characteristics of reference current values, according to an embodiment. For example, read current 524 of step N=1 may correspond to a read current of one micro-amp, read current 526 of step N=2 may correspond to a read current of two micro-amps, and so on. Of course, such particular values of read currents are merely examples, and claimed subject matter is not limited in this respect. Moreover, in an embodiment, values of individual read currents may be adjusted over time to compensate for memory cell threshold voltage for one or more particular states of memory cells that may change from proximity-disturb effects.

Current deltas may be added or subtracted to/from read currents of PCM cells for individual read-current step numbers N. For a particular numerical example, referring to FIG. 5, differences between currently measured reference cell states (e.g., possibly altered by proximity-disturb effects) and values at which reference cell states were originally programmed may be determined to be 100 nano-amps (nA) for N=2, 200 nA for N=3, zero for N=4 through 8, −200 nA for N=9, and so on. In one implementation, such current deltas may be stored in a memory and applied at a later time to another cell read process, for example. To illustrate another particular example, for a particular voltage applied to a PCM cell for step N=3, a resulting read current may be about 3.6 micro-amps. In accordance with a measured current delta of 200 nA for N=3, 200 nA may be subtracted from the read current of 3.6 micro-amps so that a modified read current equals 3.4 micro-amps. After such a subtraction, the decrease of the modified read current may compensate for the fact that reference currents, which may be used as state threshold values to which the modified read currents of PCM cells are compared, may have drifted or changed over time from their original values at program time. For example, the current threshold between a zero-bit and a one-bit may be defined to be 3.5 micro-amps. With no read current compensation, a drift of state distribution over time may result in an erroneous shift of the memory cell from the zero-bit (e.g., the memory cell read current originally being 3.4 micro-amps for N=3 at program time) to the one-bit (e.g., the memory cell read current presently being 3.6 micro-amps for N=3 after drift). On the other hand, compensating a memory cell read current using stored current deltas may reduce the memory cell read current by 200 nA. Thus a modified read current may equal 3.4 micro-amps, which is within the range of a zero-bit, so that a drifting state distribution did not lead to a changed stored state of the memory cell. Of course, such details of a process to compensate for a changing state distribution are merely examples, and claimed subject matter is not so limited.

Figure 6:
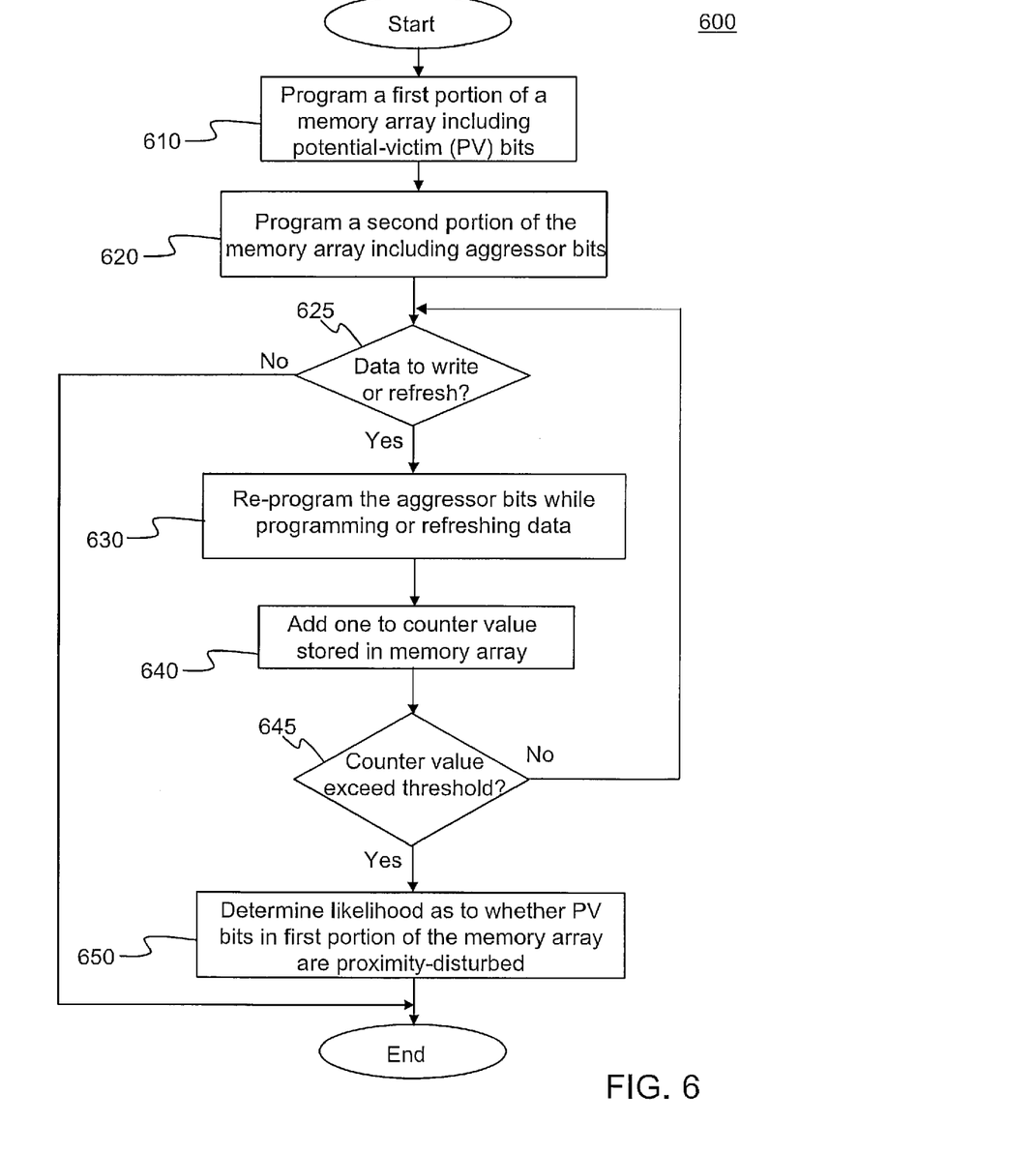
FIG. 6 is a flow diagram of a program process for a memory array, according to an embodiment.

FIG. 6 is a flow diagram of a program process 600 of a memory array, according to an embodiment. As mentioned above, program states of a portion of a memory array may be erroneously changed by a program-disturb event brought about by programming a neighboring portion of the memory array. In one implementation, correcting program states erroneously changed by a program-disturb event may be preceded by a process, such as process 600, of determining whether a proximity-disturb event has occurred. Process 600, for example, may include block 610, where a first known sequence comprising PV bits may be programmed in a first reference portion of a memory array. In one implementation, process 600 may be applied to a portion of memory such as memory 310 and 330 shown in FIG. 4. Thus, a first known sequence comprising PV bits may be programmed in a PV reference portion 316 of memory array 310. Similarly, at block 620, a second known sequence comprising aggressor bits may be programmed in an aggressor reference portion 332 of memory array 431. At diamond 625, a determination may be made as to whether a plurality of data is to be programmed in array portion 431. If so, then process 600 may proceed to block 630 where the second known sequence of aggressor bits may be re-programmed in the aggressor reference portion 332 while the data may be programmed in array portion 431.

In one implementation, a counter value may be stored in memory 300, wherein the counter value may represent a number of times that array portion 431 is programmed or re-programmed. Thus, upon or after programming or re-programming block 630, process 600 may proceed to block 640 where such a counter value may be incremented by one to represent the re-programming.

In one implementation, if a counter value exceeds a particular threshold number, as determined at diamond 645, then process 600 may proceed to block 650. At block 650, a determination of a likelihood as to whether the PV bits are proximity-disturbed may be based, at least in part, on such a counter value. One reason that proximity-disturbed may be based, at least in part, on a counter value may be that as the frequency or number of times of refreshing the state of a PCM cell increases, so may the likelihood of occurrence of a program-disturb event. As mentioned above, a program-disturb event may be induced by increasing ambient temperatures of a memory array, for example. Of course, such details of process 600 are merely examples, and claimed subject matter is not so limited.

Figure 7:
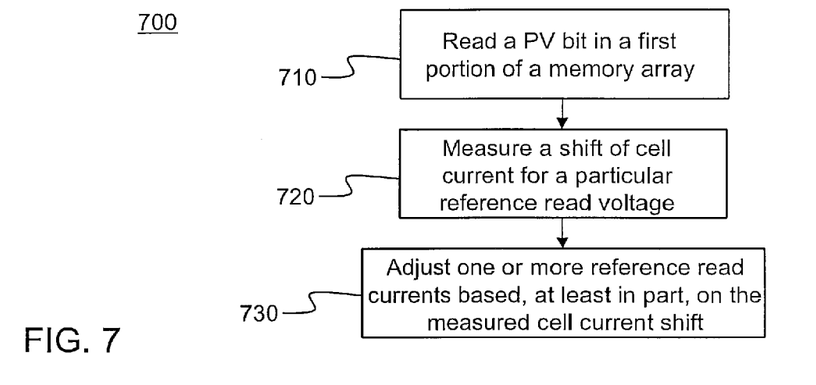
FIG. 7 is a flow diagram of a process to correct erroneous program states, according to an embodiment.

FIG. 7 is a flow diagram of a process 700 to correct erroneous program states, according to an embodiment. For example, process 700 may be performed upon or after performing process 600. At block 710, a process may be performed to read at least one PV bit of a PV reference portion of a memory array. At block 720, a process to correct erroneous program states stored in one or more cells of a memory array may comprise measuring a shift of cell current for a particular reference voltage to read the one or more memory cells. For example, a proximity-disturb event may bring about such erroneous program states. At block 730, a process to correct erroneous program states may further comprise adjusting reference currents by adding or subtracting current deltas based, at least in part, on the measured cell current shift of reference voltages. Such adding or subtracting current deltas may allow for compensating for proximity-disturb effects. Of course, such details of process 700 are merely examples, and claimed subject matter is not so limited.

Figure 8:
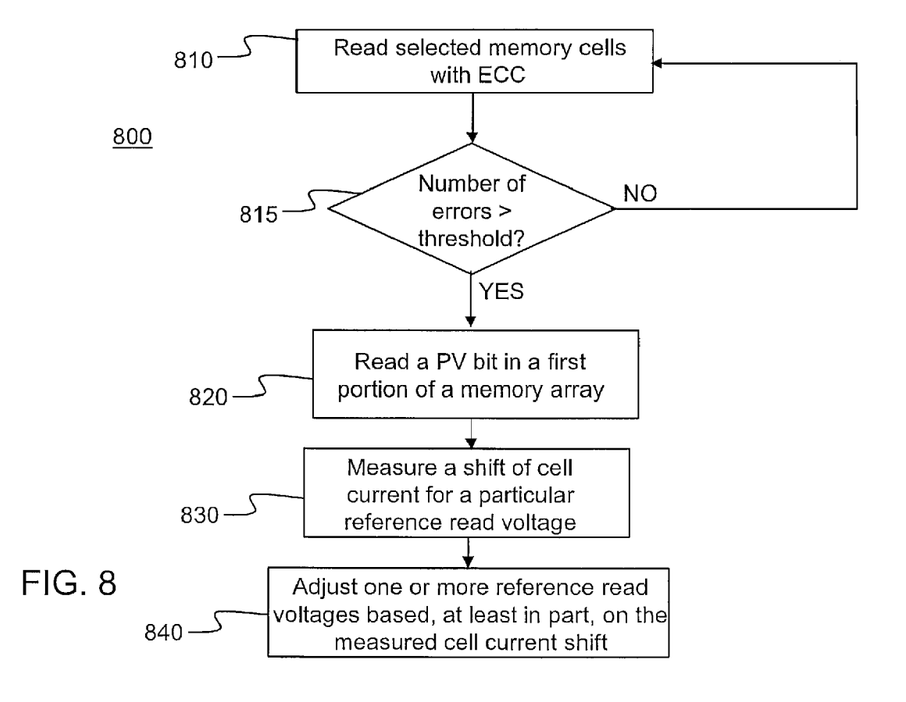
FIG. 8 is a flow diagram of a process to correct erroneous program states, according to another embodiment.

FIG. 8 is a flow diagram of a process 800 to correct erroneous program states, according to another embodiment. For example, such a process to correct erroneous program states may be performed in response to exceeding a threshold bit error rate (BER). At block 810, a process may be performed to read one or more cells of a memory array. Such a read process may involve error correction code (ECC) techniques, for example. Accordingly, at diamond 815 a determination may be made as to whether a number of read errors, which may be detected by ECC techniques while reading one or more cells of a memory array, is greater than a threshold number of errors. For example, such a threshold may correspond to an ability of a particular ECC technique to correct two errors. If such a threshold (e.g., two) is exceeded, then process 800 may proceed to block 820, where at least one PV bit of a PV reference portion of a memory array may be read. At block 830, a process to correct erroneous program states detected by ECC may comprise measuring a shift of cell current for a particular reference voltage to read the one or more memory cells. As explained above, a proximity-disturb event may bring about such erroneous program states. At block 840, a process to correct erroneous program states may further comprise adjusting reference currents by adding or subtracting current deltas based, at least in part, on the measured cell current shift of reference voltages. Such adding or subtracting current deltas may allow for compensating for proximity-disturb effects, as discussed above. Of course, such details of process 800 are merely examples, and claimed subject matter is not so limited.

Figure 9:
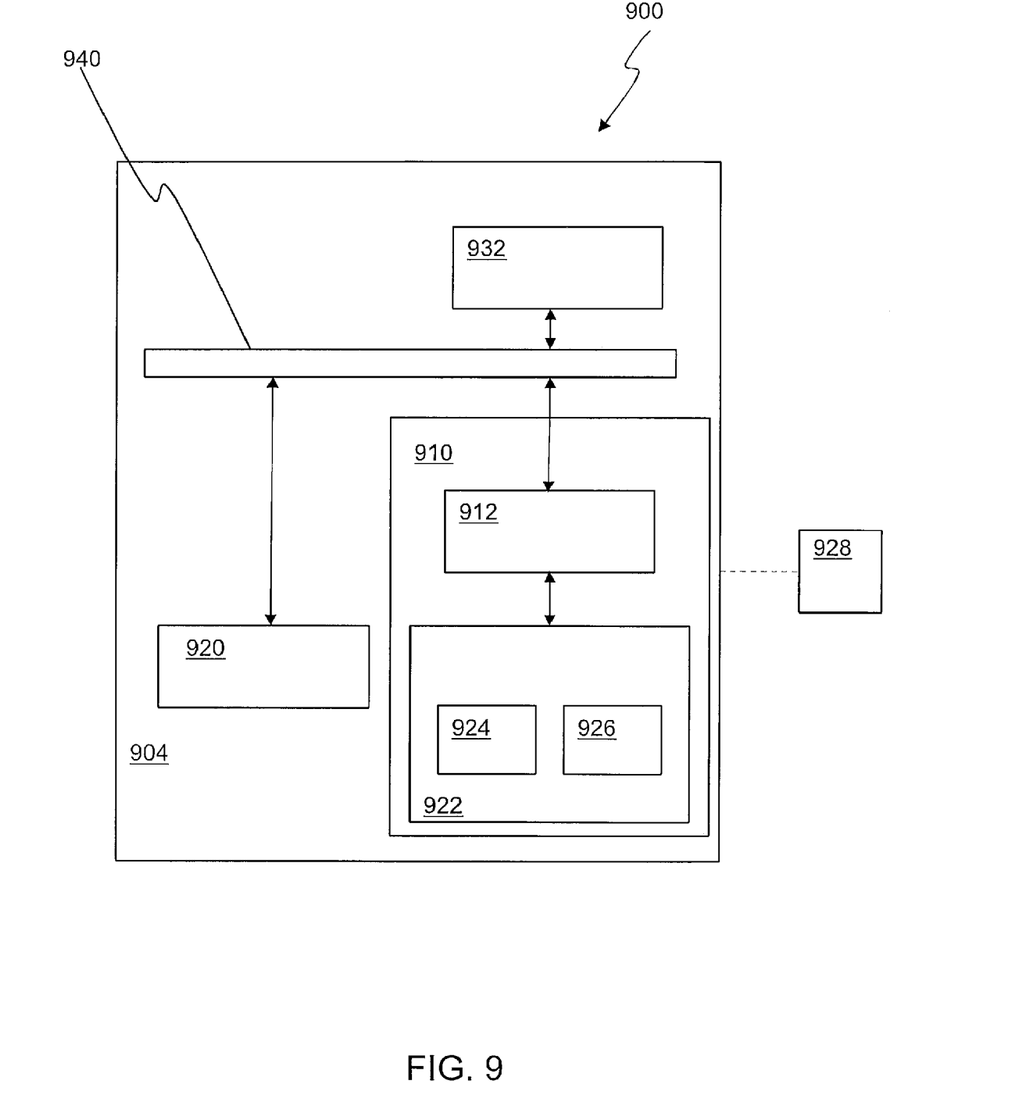
FIG. 9 is a schematic diagram illustrating an exemplary embodiment of a computing system.

FIG. 9 is a schematic diagram illustrating an embodiment of a computing system 900 including a memory device 910. Such a computing device may comprise one or more processors, for example, to execute an application or other code. For example, memory device 910 may comprise memory array 100, shown in FIG. 1. A computing device 904 may be representative of any device, appliance, or machine that may be configurable to manage memory device 910. Memory device 910 may include a memory controller 915 and a memory 922, which may comprise PCM, for example. By way of example but not limitation, computing device 904 may include: one or more computing devices or platforms, such as, e.g., a desktop computer, a laptop computer, a workstation, a server device, or the like; one or more personal computing or communication devices or appliances, such as, e.g., a personal digital assistant, mobile communication device, or the like; a computing system or associated service provider capability, such as, e.g., a database or information storage service provider/system; or any combination thereof.

It is recognized that all or part of the various devices shown in system 900, and the processes and methods as further described herein, may be implemented using or otherwise including hardware, firmware, software, or any combination thereof. Thus, by way of example but not limitation, computing device 904 may include at least one processing unit 920 that is operatively coupled to memory 922 through a bus 940 and a host or memory controller 915.

Processing unit 920 is representative of one or more circuits configurable to perform at least a portion of an information computing procedure or process. By way of example but not limitation, processing unit 920 may include one or more processors, controllers, microprocessors, microcontrollers, application specific integrated circuits, digital signal processors, programmable logic devices, field programmable gate arrays, and the like, or any combination thereof. Processing unit 920 may include an operating system configured to communicate with memory controller 915. Such an operating system may, for example, generate commands to be sent to memory controller 915 over bus 940. Such commands may comprise read or write commands. In response to a write command, for example, memory controller 915 may program a first known sequence of bits to a first portion of a memory array, program a second known sequence of bits to a second portion of the memory array, re-program the second known sequence of bits to the second portion while programming data to a third portion of the memory array, and determine a likelihood as to whether the first known sequence of bits in the first portion is proximity-disturbed by the re-programming. In one implementation, processing unit 920 may provide a first and second known sequences of bits to memory controller 915, for example.

Of course, such details of a portion of memory are merely examples, and claimed subject matter is not so limited.

Memory 922 is representative of any information storage mechanism. Memory 922 may include, for example, a primary memory 924 or a secondary memory 926. Primary memory 924 may include, for example, a random access memory, read only memory, etc. While illustrated in this example as being separate from processing unit 920, it should be understood that all or part of primary memory 924 may be provided within or otherwise co-located/coupled with processing unit 920.

Secondary memory 926 may include, for example, the same or similar type of memory as primary memory or one or more information storage devices or systems, such as, for example, a disk drive, an optical disc drive, a tape drive, a solid state memory drive, etc. In certain implementations, secondary memory 926 may be operatively receptive of, or otherwise configurable to couple to, a computer-readable medium 928. Computer-readable medium 928 may include, for example, any medium that can carry or make accessible information, code, or instructions for one or more of the devices in system 900. Computing device 904 may include, for example, an input/output 932. Input/output 932 is representative of one or more devices or features that may be configurable to accept or otherwise introduce human or machine inputs, or one or more devices or features that may be configurable to deliver or otherwise provide for human or machine outputs. By way of example but not limitation, input/output device 932 may include an operatively configured display, speaker, keyboard, mouse, trackball, touch screen, data port, etc.

It will, of course, be understood that, although particular embodiments have just been described, claimed subject matter is not limited in scope to a particular embodiment or implementation. For example, one embodiment may be in hardware, such as implemented on a device or combination of devices, for example. Likewise, although claimed subject matter is not limited in scope in this respect, one embodiment may comprise one or more articles, such as a storage medium or storage media that may have stored thereon instructions capable of being executed by a specific or special purpose system or apparatus, for example, to lead to performance of an embodiment of a method in accordance with claimed subject matter, such as one of the embodiments previously described, for example. However, claimed subject matter is, of course, not limited to one of the embodiments described necessarily. Furthermore, a specific or special purpose computing platform may include one or more processing units or processors, one or more input/output devices, such as a display, a keyboard or a mouse, or one or more memories, such as static random access memory, dynamic random access memory, flash memory, or a hard drive, although, again, claimed subject matter is not limited in scope to this example.

The terms, "and" and "or" as used herein may include a variety of meanings that will depend at least in part upon the context in which it is used. Typically, "or" if used to associate a list, such as A, B or C, is intended to mean A, B, and C, here used in the inclusive sense, as well as A, B or C, here used in the exclusive sense. Embodiments described herein may include machines, devices, engines, or apparatuses that operate using digital signals. Such signals may comprise electronic signals, optical signals, electromagnetic signals, or any form of energy that provides information between locations.

In the preceding description, various aspects of claimed subject matter have been described. For purposes of explanation, specific numbers, systems, or configurations may have been set forth to provide a thorough understanding of claimed subject matter. However, it should be apparent to one skilled in the art having the benefit of this disclosure that claimed subject matter may be practiced without those specific details. In other instances, features that would be understood by one of ordinary skill were omitted or simplified so as not to obscure claimed subject matter.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method for operating a memory device, comprising:
   reading a plurality of memory cells of a memory array;
   determining a total number of read errors in reading the plurality of memory cells; and
   adjusting reference read currents if the total number of read errors exceeds an error threshold, wherein adjusting reference read currents comprises:
   reading a reference memory cell;
   determining a current shift for the reference memory cell; and
   adjusting read currents for other memory cells of the memory array by a current delta based, at least in part, on the current shift.

2. The method of claim 1, wherein adjusting read currents comprises adding or subtracting the current delta from a reference cell current to determine states of the other memory cells.

3. The method of claim 1, wherein the reference memory cell has a predetermined state, wherein determining the current shift comprises determining a difference between an expected cell current and an actual cell current for the reference memory cell at a reference voltage.

4. The method of claim 3, wherein the predetermined state of the reference memory cell is an amorphous state.

5. The method of claim 1, wherein the plurality of memory cells store a known sequence of bits.

6. The method of claim 5, further comprising, before reading the plurality of memory cells, programming another plurality of memory cells neighboring the plurality of memory cells.

7. The method of claim 6, wherein reading the plurality of memory cells is performed after programming the other plurality of memory cells neighboring the plurality of memory cells.

8. The method of claim 6, wherein the plurality of memory cells are disposed on a wordline and the other plurality of memory cells are disposed on another wordline, wherein the wordline is immediately adjacent the other wordline.

9. A memory device, comprising:
   a controller configured to:
   read a plurality of memory cells of a memory array;
   determine a total number of read errors in reading the plurality of memory cells; and
   adjust reference read currents if the total number of read errors exceeds an error threshold, wherein adjusting reference read currents comprises:
   reading a reference memory cell;
   determining a current shift for the reference memory cell; and
   adjusting read currents for other memory cells of the memory array by a current delta based, at least in part, on the current shift.

10. The memory device of claim 9, wherein the memory array is a phase change memory (PCM) array.

11. The memory device of claim 9, wherein the reference memory cell is located in a memory buffer.

12. The memory device of claim 9, wherein the controller is configured to refresh another plurality of memory cells neighboring the plurality of memory cells before reading the plurality of memory cells.

13. The memory device of claim 9, wherein the controller is configured to refresh another plurality of memory cells neighboring the plurality of memory cells before reading the plurality of memory cells.

14. The memory device of claim 13, wherein the plurality of memory cells stores a known sequence of bits and the other plurality of memory cells are refreshed with another known sequence of bits.

15. The memory device of claim 14, wherein the plurality of memory cells and the other plurality of memory cells are disposed on directly neighboring word lines.

16. The memory device of claim 9, wherein the controller is configured to adjust read currents by adding or subtracting the current delta from a reference cell current to determine states of the other memory cells.

17. A system, comprising:
   a memory device comprising a controller configured to:
   read a plurality of memory cells of a memory array;
   determine a total number of read errors in reading the plurality of memory cells; and
   adjust reference read currents if the total number of read errors exceeds an error threshold, wherein adjusting reference read currents comprises:
   reading a reference memory cell;
   determining a current shift for the reference memory cell; and
   adjusting read currents for other memory cells of the memory array by a current delta based, at least in part, on the current shift.

18. The system of claim 7, wherein the system is a computer system.

19. The system of claim 17, wherein the memory cells are phase change memory cells.

20. The system of claim 17, wherein the controller is configured to adjust read currents by adding or subtracting the current delta from a reference cell current to determine states of the other memory cells.

* * * * *